United States Patent [19]
Yang

[11] Patent Number: 5,474,954
[45] Date of Patent: Dec. 12, 1995

[54] METHOD OF MANUFACTURING SEMICONDUCTOR LASER DIODE USING SELF ALIGNMENT

[75] Inventor: Seung-kee Yang, Seoul, Rep. of Korea

[73] Assignee: Samsung Electronics Co., Ltd., Kyungki, Rep. of Korea

[21] Appl. No.: 327,047

[22] Filed: Oct. 21, 1994

[30] Foreign Application Priority Data

Mar. 30, 1994 [KR] Rep. of Korea .................. 1994-6599

[51] Int. Cl.$^6$ .................................................. H01L 21/20
[52] U.S. Cl. ............................................ 437/129; 437/126
[58] Field of Search .................................. 437/129, 126

[56] References Cited

U.S. PATENT DOCUMENTS 5,256,580  10/1993  Gaw et al. .............................. 437/129
5,288,659  2/1994  Koch et al. .............................. 437/129

FOREIGN PATENT DOCUMENTS 0283685  12/1987  Japan .................................... 437/129

Primary Examiner—R. Bruce Breneman
Assistant Examiner—Ramamohan Rao
Attorney, Agent, or Firm—Rothwell, Figg, Ernst & Kurz

[57] ABSTRACT

A manufacturing method of a semiconductor laser diode is disclosed in which a current cutoff layer is formed on the wall of a first metal layer by a low-temperature process such as plasma-enhanced chemical vapor deposition and the gas composition ratio of the reactive ion etching process is appropriately controlled so that the maximum area can be secured for a self-aligned first metal exposing area, i.e., an ohmic contact area. This minimizes the generation of heat during lasing and enhances reliability. Further, the present invention stabilizes the process by self alignment.

9 Claims, 6 Drawing Sheets

METHOD OF MANUFACTURING SEMICONDUCTOR LASER DIODE USING SELF ALIGNMENT

BACKGROUND OF THE INVENTION

The present invention relates to a semiconductor laser diode employed in an optical-information processing system counter and laser pointer for optical communication, and more particularly, to a method of manufacturing a ridge-structured semiconductor laser diode formed using self alignment, to have a small luminescence area for high density and high-speed information processing in optical communication.

FIG. 1 is a cross-sectional view of a conventional ridge-structured semiconductor laser diode. Referring to FIG. 1, an n-GaAs buffering layer 2, an n-type first cladding layer 3, a first waveguide layer 4, an activating layer 5 and a second waveguide layer 4 are sequentially stacked on an n-GaAs substrate 1. Sequentially, a p-type second cladding layer 7 having three ridges is stacked thereon. A cap layer 8 is formed respectively on the three ridges.

On the ridged second cladding layer 7 on which cap layer 8 is formed, current cutoff layer 9 is stacked excluding the aperture for current injection placed at the top center of the intermediate ridge. A p-type metal layer 10 is stacked over the resultant structure and is in contact with part of cap layer 8 via the aperture of current cutoff layer 9 in order to transmit injected currents. Meanwhile, an n-type metal layer 11 is deposited on the bottom of substrate 1 and serves as an electrode together with the metal layer 10 which also acts as an electrode.

Now, the method for forming a ridged semiconductor laser diode as above will be discussed.

The n-GaAs buffering layer 2, n-type first cladding layer 3, first waveguide layer 4, activating layer 5, second waveguide layer 6, p-type second cladding layer 7 and cap layer 8 are sequentially stacked on n-GaAs substrate 1.

The stack is etched by photolithography so that two grooves are dug deeply to second cladding layer 7 so as to form three ridges. The current cutoff layer 9 is formed on the overall resultant structure of the ridged stack. Using an appropriate mask, the top surface of the middle ridge is etched via photolithography, to thereby form aperture 12. Metal layer 10 is deposited over the stack on which aperture 12 is formed, completing the device.

However, in the above manufacturing method of the ridge-structured semiconductor laser diode, misalignment is likely to occur due to the photolithography process using a mask for forming aperture 12 for current injection. Further, the narrow ohmic contact area between cap layer 8 and metal layer 10 via aperture 12 generates severe heat in lasing. This is a hindrance to the reliability of the finished device, which is a vital problem to be overcome for optical communication.

SUMMARY OF THE INVENTION

Therefore, in order to overcome such a problem, it is an object of the present invention to provide a manufacturing method of a semiconductor laser diode in which an ohmic contact area serving as the current injecting portion of the device is broad to exhibit an excellent heat irradiation in lasing, and the contact area between a ridge and a second metal layer is increased independent of the ohmic contact area.

Accordingly, there is provided a manufacturing method of a semiconductor laser diode comprising the steps of: (a) sequentially growing and stacking a first-conduction type buffering layer, a first-conduction type cladding layer, a first waveguide layer, an activating layer, a second waveguide layer, a second-conduction type cladding layer, and a second-conduction type cap layer on a first-conduction type semiconductor substrate; (b) forming a channel mask on both edges of the cap layer grown in step (a); (c) forming a predetermined size of a first metal layer for ohmic contact between the channel mask formed in step (b); (d) selectively etching the resultant structure of step (c) to a predetermined depth by using the channel mask and first metal layer as a mask, to thereby form a ridge on which the first metal layer is formed; (e) forming a current cutoff layer over the ridge portion and the etched portion formed in step (d); (f) coating photoresist on the current cutoff layer formed in step (e) and selectively removing the photoresist and current cutoff layer so as to expose the first metal layer; (g) removing the photoresist remaining in step (f); and (h) depositing a second metal layer on the substrate from which the photoresist is removed in step (g).

BRIEF DESCRIPTION OF THE DRAWINGS

The above object and advantages of the present invention will become more apparent by describing in detail a preferred embodiment thereof with reference to the attached drawings in which.

DETAILED DESCRIPTION OF THE INVENTION

Figure 1:
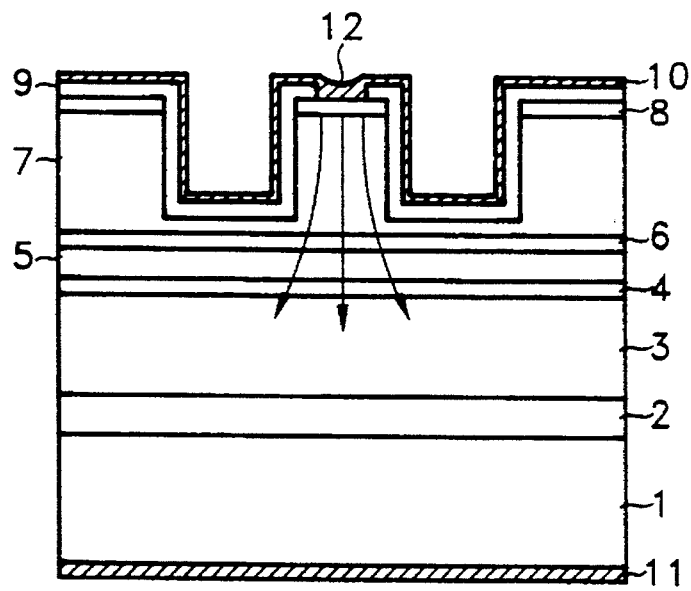
FIG. 1 is a vertical cross-sectional view of a conventional semiconductor laser diode.
Figure 2:
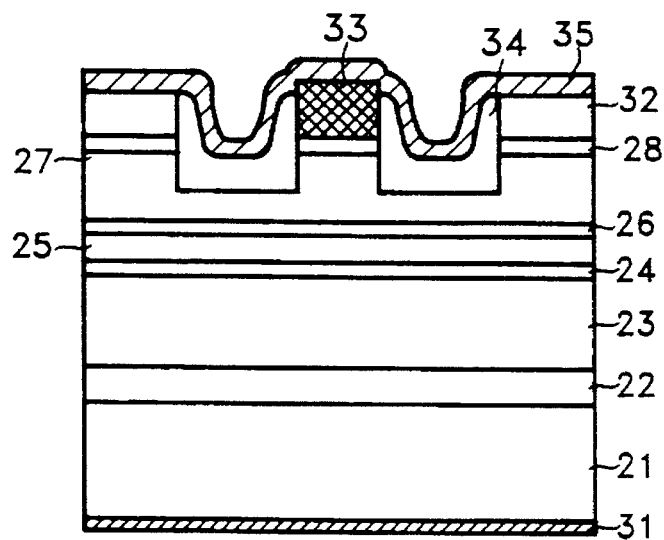
FIG. 2 is a vertical cross-sectional view of a semiconductor laser diode according to the manufacturing method of the present invention.

Referring to FIG. 2, on an n-type GaAs substrate 21 are sequentially stacked an n-type GaAs buffering layer 22, an n-type first cladding layer 23, a first waveguide layer 24, an activating layer 25 and a second waveguide layer 26. A first metal layer 33 for current injection is in ohmic contact with cap layer 28 on the ridge of second cladding layer 27 on which cap layer 28 is stacked. A channel mask 32 of silicon oxide is formed on cap layer 28 excluding the ridged area thereof and serves as an insulating layer. A current cutoff layer 34 is coated on the two etched recesses forming the ridge structure and forms a connection with channel mask 32 and first metal layer 33. A second metal layer 35 is deposited on the entire resultant structure, for transmitting injected current. Meanwhile, an n-type third metal layer 31 is deposited on the bottom of substrate 21 and serves as an electrode together with the metal layer 35 which also acts as an electrode.

Now, a manufacturing method of a semiconductor laser diode of the present invention will be described with reference to FIGS. 3–17.

Figure 3:
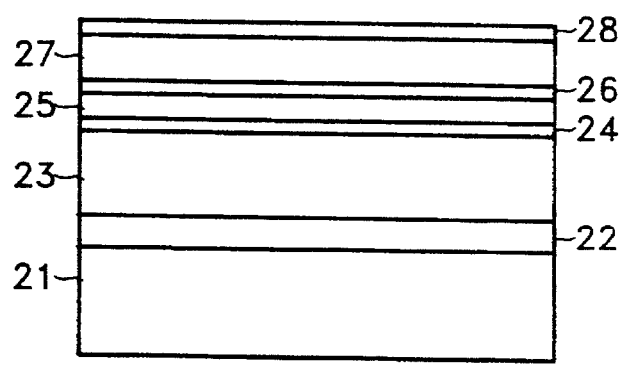
FIGS. 3–17 are vertical cross-sectional views of illustrating the manufacturing process of the semiconductor laser diode of the present invention.

First, as shown in FIG. 3, on n-type (first type) GaAs substrate 21 are sequentially grown and stacked n-type GaAs buffering layer 22, n-type first cladding layer 23, first waveguide layer 24, activating layer 25, second waveguide layer 26, p-type (second type) second cladding layer 27 and cap layer 28 (growth step).

Figure 4:
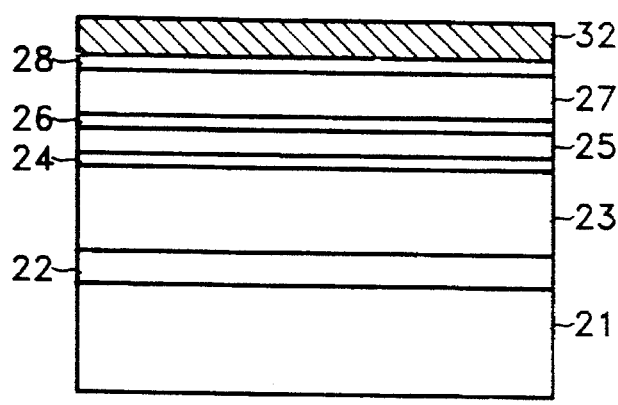
Figure 5:
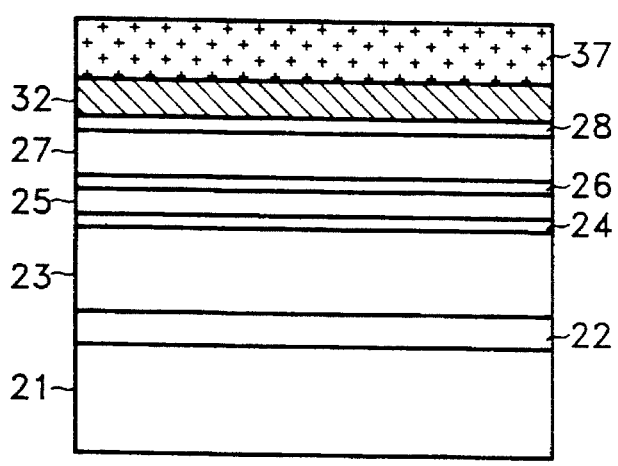
Figure 6:
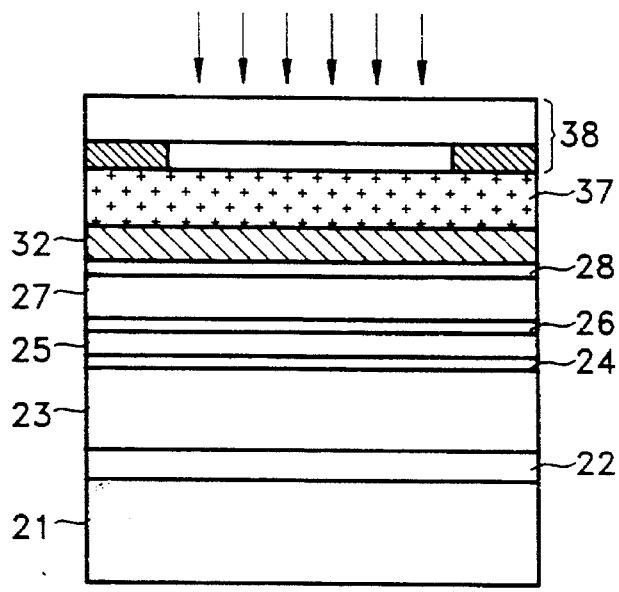
Figure 7:
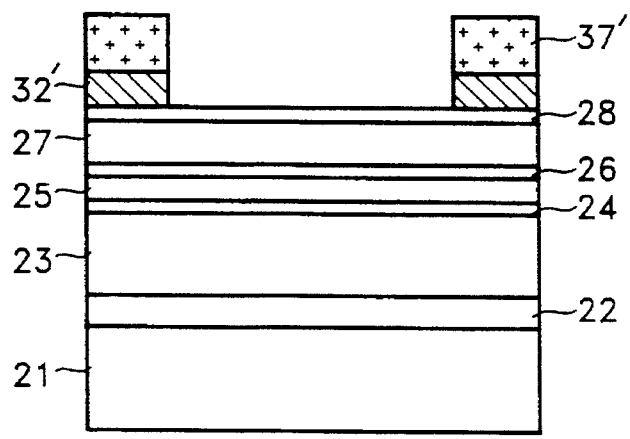
Figure 8:
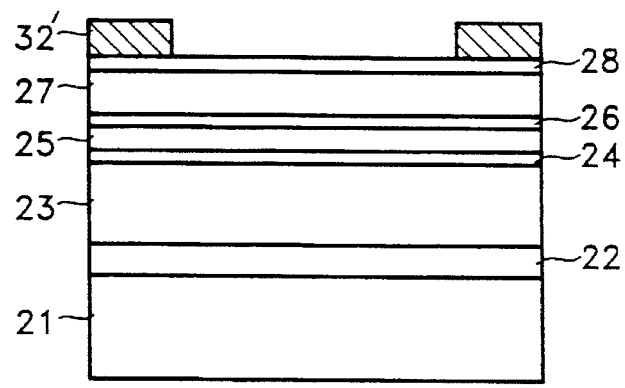

Next, a silicon oxide layer 32 is deposited on the grown stack by using a plasma-enhanced chemical vapor deposition (CVD) method, as shown in FIG. 4, which will be subsequently etched by photolithography to form a channel mask 32'. Then, as shown in FIG. 5, a photoresist 37 is coated on silicon oxide layer 32. FIG. 6 shows a step of exposing the photoresist with a chromium mask 38. FIG. 7 shows a step of developing the exposed photoresist without the Cr mask 38, thereby etching the SiO₂ 32' deposited by the PECVD. FIG. 8 shows a step of completing the channel mask 32' after removing the developed photoresist 37'.

The channel mask 32' is used to form a dual-ridge structure for the improvement of device reliability. In other words, the dual ridge is designed to reduce the damage of a lower layer due to mechanical stress during device assembly. With a single ridge, damage to the lower layer is severe.

Here, the characteristics of the plasma-enhanced CVD process will be explained below.

The plasma-enhanced CVD process, using an RF-induced glow discharge in order to transmit energy to reaction gas, is advantageous in that a deposition process can be performed at a lower temperature than with atmospheric pressure CVD or low pressure CVD. Therefore, the plasma-enhanced CVD process provides a method for depositing layers on a substrate which is too thermally unstable to be coated by other methods, such as forming a silicon nitride or silicon oxide layer on a metal layer. The plasma-enhanced CVD process forms ionized species or radicals in which the overall reaction gas is plasma-activated or decomposed by RF energy inside a deposition chamber. Such ionized species or radicals are incident on and reflected from the heated substrate, to thereby form a thin layer.

Figure 9:
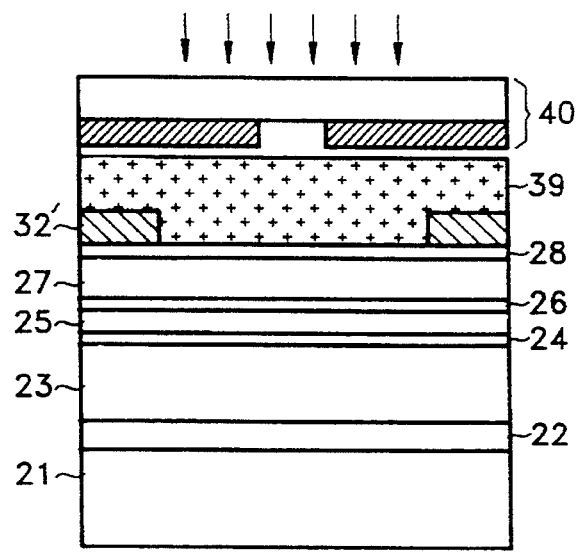
Figure 10:
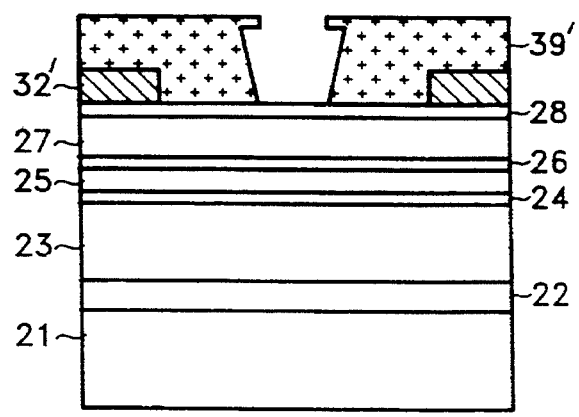
Figure 11:
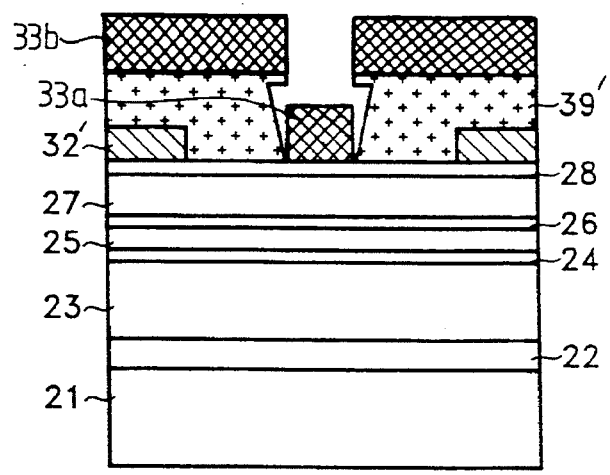
Figure 12:
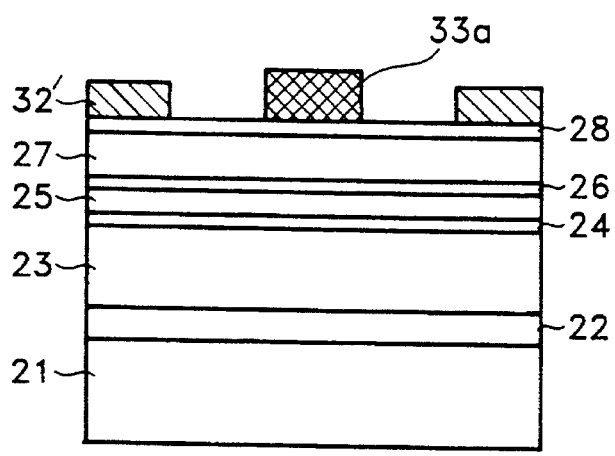

As shown in FIG. 9, a photoresist 39 is coated on cap layer 28 on which channel mask 32' is formed. Then, a chromium mask 40 is put on photoresist 39 which is then exposed and developed as shown in FIG. 10. As shown in FIG. 11, a first metal (33a and 33b) is deposited on the resultant structure so as to come into ohmic contact with the central exposed portion of cap layer 28. Then, in FIG. 12, unnecessary photoresist 39' and the first metal layer 33b thereon on channel mask 32' are removed by lift off, thereby forming first metal layer 33a (step of forming the first metal layer).

The above lift off step, contrary to a removing step used in the etching method, is a technique for forming a pattern on a wafer according to an additional process. Here, an inverse pattern is first formed on the wafer using a stencil, and a predetermined position of substrate is exposed. Consequently, a layer to be patterned is deposited on the inverse-patterned stencil and the exposed substrate. The inverse pattern deposited on the stencil and the layer material thereon are removed when the wafer is immersed in a solution for dissolving the stencil. In other words, the layer deposited on the stencil is lifted off while the stencil is dissolved. The layer material deposited on the exposed portion of the substrate is left and will be used in a later process. For the success of the lift off, it is important that there should be a distinct gap between the layer material placed on the stencil and the layer material deposited on the exposed substrate.

Figure 13:
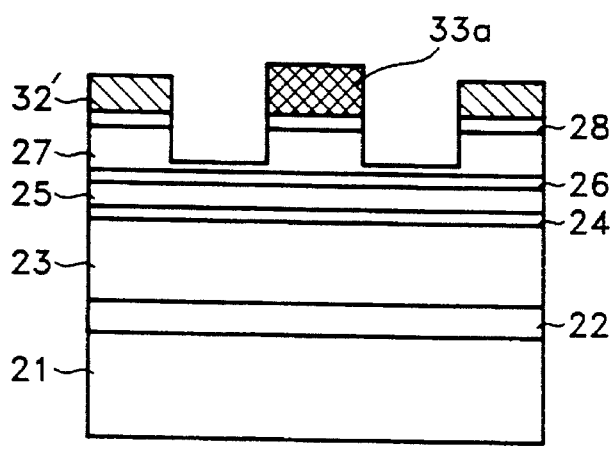

Sequentially, as shown in FIG. 13, IIIA-group (p type) or VA-group (n type) chemical compounds of the portions of cap layer 28 and second cladding layer 27 between two channel patterns and the first metal layer, are etched to a predetermined depth by a reactive-ion etching process, thereby forming a ridge structure (first etching step). By doing so, a transition of pattern which is the same as a mask and is an advantage of dry etching, is performed so that the width of the ridges and the area of ohmic contact coincide with each other to thereby secure a maximum ohmic contact area.

Figure 14:
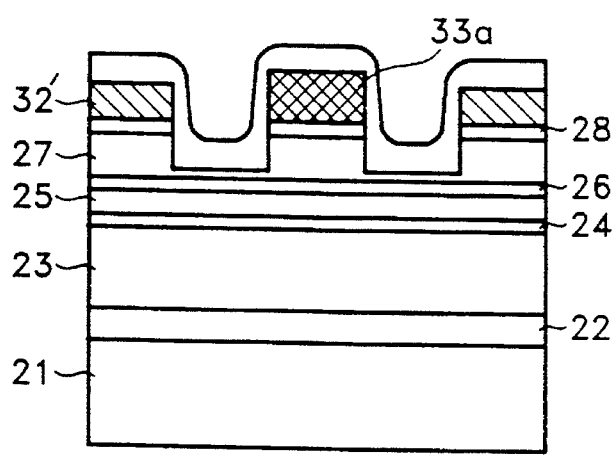
Figure 15:
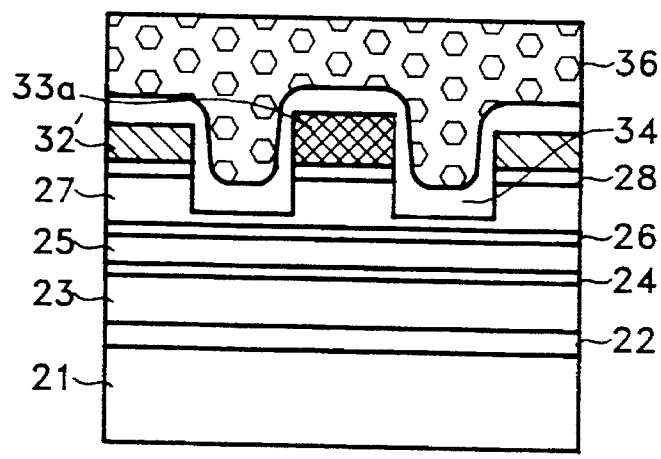

As explained above, current cutoff layer 34 of silicon oxide is deposited over the ridge structure of the substrate by the plasma-enhanced CVD as shown in FIG. 14, and photoresist 36 is evenly coated thereon, as shown in FIG. 15.

Figure 16:
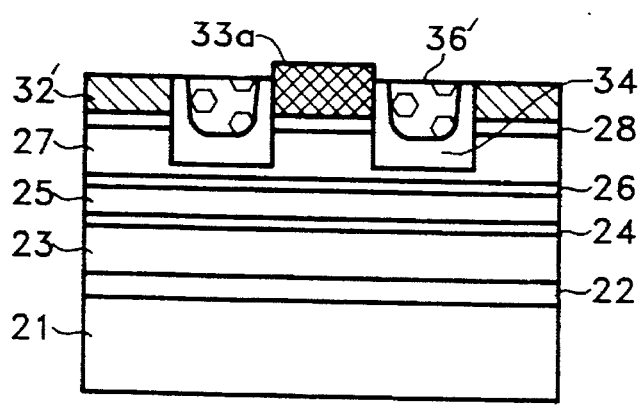

As shown in FIG. 16, the resultant structure is etched by a dry etching method (i.e., plasma etching, reactive-ion etching or MERIE), to thereby expose first metal layer 33a (second etching step). Here, by appropriately controlling the gas composition ratio of the reactive-ion etching step for etching photoresist and plasma-enhanced CVD materials (e.g., oxide and aluminum oxide), and silicon oxide or aluminum oxide, the etching selection ratio of the current cutoff layer formed of the silicon oxide or aluminum oxide with respect to the photoresist is set to 1:1. This secures the maximum exposing area for the self-aligned first metal (p-type), which contributes to process stabilization and the reliability of the device while improving the thermal characteristics of the device.

Figure 17:
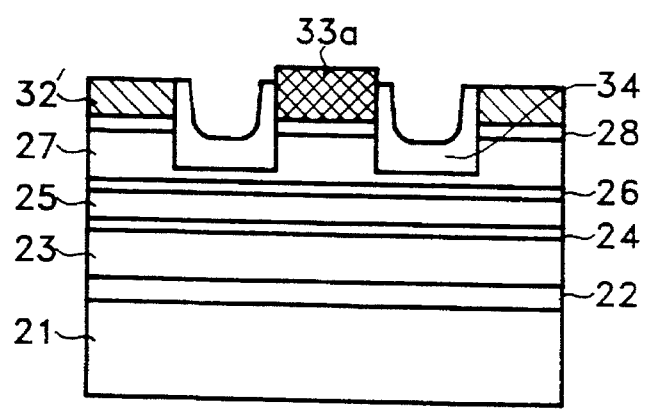

Referring to FIG. 17, remaining photoresist 36' is removed by plasma ashing (third etching step). Then, as shown in FIG. 2 which shows a complete device, second metal layer 35 is deposited thereon (second metal deposition step). An n-type metal is deposited on the bottom of substrate 21 to complete a semiconductor laser diode according to the manufacturing method of the present invention.

As described above, in the manufacturing method of the semiconductor laser diode of the present invention, the current cutoff layer is formed on the wall of the first metal layer by a low-temperature process such as plasma-enhanced chemical vapor deposition and the gas composition ratio of the reactive ion etching process is appropriately controlled so that the maximum area can be secured for the self-aligned first metal exposing area, i.e., an ohmic contact area. This minimizes the generation of heat during lasing and enhances reliability. Further, the present invention stabilizes the process by self alignment.

Moreover, the present invention is capable of reducing the width of ridge regardless of an ohmic contact area and planarizing the deposition thickness by the PECVD, thereby preventing the device from being damaged in packaging the device. This also stabilizes a succeeding process, resulting in increasing productivity.

What is claimed is:

1. A method for manufacturing a semiconductor laser diode comprising the steps of:

(a) sequentially growing and stacking a buffering layer, a first cladding layer, a first waveguide layer, an activating layer, a second waveguide layer, a second cladding layer, and a cap layer on a top side of a semiconductor substrate;

(b) forming a channel mask on two edges of said cap layer;

(c) forming a first metal layer of a size in ohmic contact with said cap layer between said channel mask formed in said step (b);

(d) selectively etching the resultant structure of said step (c) to a depth using said channel mask and said first metal layer as a mask, to thereby form a ridge on which said first metal layer is located;

(e) forming a current cutoff layer over the ridge portion and the etched portion formed in said step (d);

(f) coating photoresist on said current cutoff layer formed in said step (e) and selectively removing said photoresist and current cutoff layer so as to expose said first metal layer;

(g) removing said photoresist remaining in said step (f); and (h) depositing a second metal layer on said top side of said semiconductor.

2. A method for manufacturing a semiconductor laser diode as claimed in claim 1, wherein said step (b) comprising the steps:

forming a film for said channel mask on said cap layer of said substrate after said step (a); and etching said film formed in said film forming step by a photolithography process.

3. A method for manufacturing a semiconductor laser diode as claimed in claim 2, wherein said film forming step is performed by plasma-enhanced chemical vapor deposition.

4. A method for manufacturing a semiconductor laser diode as claimed in claim 1, wherein said step (c) comprising the steps of:

evenly coating a photoresist on said cap layer and said channel mask;

putting a mask for said first metal layer on said photoresist, exposing said photoresist and developing said photoresist;

depositing a first metal layer on said substrate; and selectively removing said first metal layer and said photoresist thereunder by lift off, thereby leaving said first metal deposited on a selected portion of said cap layer.

5. A method for manufacturing a semiconductor laser diode as claimed in claim 1, wherein said step (e) is performed by plasma-enhanced chemical vapor deposition.

6. A method for manufacturing a semiconductor laser diode as claimed in claim 1, wherein said step (d) is performed by reactive ion etching.

7. A method for manufacturing a semiconductor laser diode as claimed in claim 1, wherein the removing of said photoresist and current cutoff layer of step (f) uses self-alignment by reactive ion etching for said current cutoff layer and photoresist.

8. A method for manufacturing a semiconductor laser diode as claimed in claim 7, wherein in etching said current cutoff layer and photoresist by reactive ion etching in step (f), the composition ratio of gas used in said reactive ion etching is controlled so that the etching speeds of said photoresist and current cutoff layer are equal.

9. A method for manufacturing a semiconductor laser diode as claimed in claim 1, wherein in step (g), said photoresist left in said step (f) is removed by plasma ashing.

\* \* \* \* \*